US008876330B2

(12) United States Patent
Sievers et al.

(10) Patent No.: US 8,876,330 B2
(45) Date of Patent: Nov. 4, 2014

(54) ILLUMINATION DEVICE

(71) Applicant: Illinois Tools Works Inc., Glenview, IL (US)

(72) Inventors: Steven J. Sievers, Algonquin, IL (US); Chong Soo Kim, Hoffman Estates, IL (US)

(73) Assignee: Illinois Tool Works Inc., Glenview, IL (US)

( * ) Notice: Subject to any disclaimer, the term of this patent is extended or adjusted under 35 U.S.C. 154(b) by 92 days.

(21) Appl. No.: 13/786,906

(22) Filed: Mar. 6, 2013

(65) Prior Publication Data

US 2014/0133141 A1    May 15, 2014

Related U.S. Application Data

(60) Provisional application No. 61/726,675, filed on Nov. 15, 2012.

(51) Int. Cl.
| | |
|---|---|
| *F21V 19/00* | (2006.01) |
| *H01L 33/62* | (2010.01) |
| *H01L 25/075* | (2006.01) |
| *H01L 33/48* | (2010.01) |
| *F21V 21/00* | (2006.01) |
| *H01L 33/58* | (2010.01) |

(52) U.S. Cl.
CPC ............. *F21V 21/00* (2013.01); *H01L 33/62* (2013.01); *H01L 2224/48091* (2013.01); *H01L 25/0753* (2013.01); *H01L 33/58* (2013.01); *H01L 33/486* (2013.01); *H01L 2224/48227* (2013.01)
USPC ....................................... 362/244; 362/249.02

(58) Field of Classification Search
USPC ............................................ 362/249.02, 244
See application file for complete search history.

(56) References Cited

U.S. PATENT DOCUMENTS

| 4,471,415 | A | * | 9/1984 | Larson et al. ............. 362/249.14 |
| RE34,254 | E | * | 5/1993 | Dragoon ....................... 362/307 |

(Continued)

FOREIGN PATENT DOCUMENTS

| DE | EP1319889 | * | 6/2003 | .............. H01F 38/14 |
| DE | 102010026343 | A1 | 3/2012 | |
| EP | 1858089 | A2 | 11/2007 | |

OTHER PUBLICATIONS

Lumex illumination device having part No. SML-LXR851IGC-TR, published at least as early as Nov. 14, 2012.

(Continued)

*Primary Examiner* — Ali Alavi
(74) *Attorney, Agent, or Firm* — Klintworth & Rozenblat IP LLC

(57) ABSTRACT

Illumination devices are provided. In one aspect, an illumination device includes a housing including a plurality of electrically conductive leads. The illumination device also includes a lens unitarily formed as one-piece with the housing and a first light source electrically coupled to at least one of the plurality of electrically conductive leads and positioned behind the lens. The first light source is adapted to emit light of a first color. The illumination device further includes a second light source electrically coupled to at least another one of the plurality of electrically conductive leads and positioned behind the lens. The second light source is adapted to emit light of a second color different than the first color. The illumination device is adapted to be coupled to a surface of a substrate and emit light through the lens generally parallel to the surface.

20 Claims, 2 Drawing Sheets

(56) References Cited

U.S. PATENT DOCUMENTS

| | | | |
|---|---|---|---|
| 5,951,152 A | | 9/1999 | Zabawski et al. |
| D422,929 S | * | 4/2000 | Zabawski et al. ......... D10/106.1 |
| 6,371,637 B1 | * | 4/2002 | Atchinson et al. ............ 362/555 |
| 7,438,452 B2 | * | 10/2008 | Nawashiro .................... 362/490 |
| 8,157,417 B2 | * | 4/2012 | Chen ............................. 362/256 |
| 8,188,411 B2 | * | 5/2012 | McCarthy ................... 244/3.16 |
| 8,226,270 B2 | * | 7/2012 | Yamamoto et al. ........... 362/294 |
| 8,283,844 B2 | * | 10/2012 | Cho et al. ...................... 313/113 |
| 8,596,826 B2 | * | 12/2013 | Aggarwal et al. ............. 362/294 |
| 2006/0187659 A1 | * | 8/2006 | Nawashiro .................... 362/234 |
| 2009/0139755 A1 | | 6/2009 | Kusano |
| 2009/0284130 A1 | * | 11/2009 | Tsuji et al. .................... 313/502 |
| 2010/0264450 A1 | | 10/2010 | Norfidathul et al. |

OTHER PUBLICATIONS

Dialight illumination device having part No. 595-2x01-0xx, published at least as early as Nov. 14, 2012.

Lumex illumination device having part No. SML-LX2832IGC-TR, published at least as early as Nov. 14, 2012.

Lumex illumination device having part No. SMF-2432GC-TR, published at least as early as Nov. 14, 2012.

Lumex illumination device having part No. SML-LX1206AC-TR, published at least as early as Nov. 14, 2012.

Lumex illumination device having part No. SSF-LXH103SUGD, published at least as early as Nov. 14, 2012.

International Search Report and Written Opinion for PCT/US2013/069539, dated Feb. 28, 2014, 11 pages.

* cited by examiner

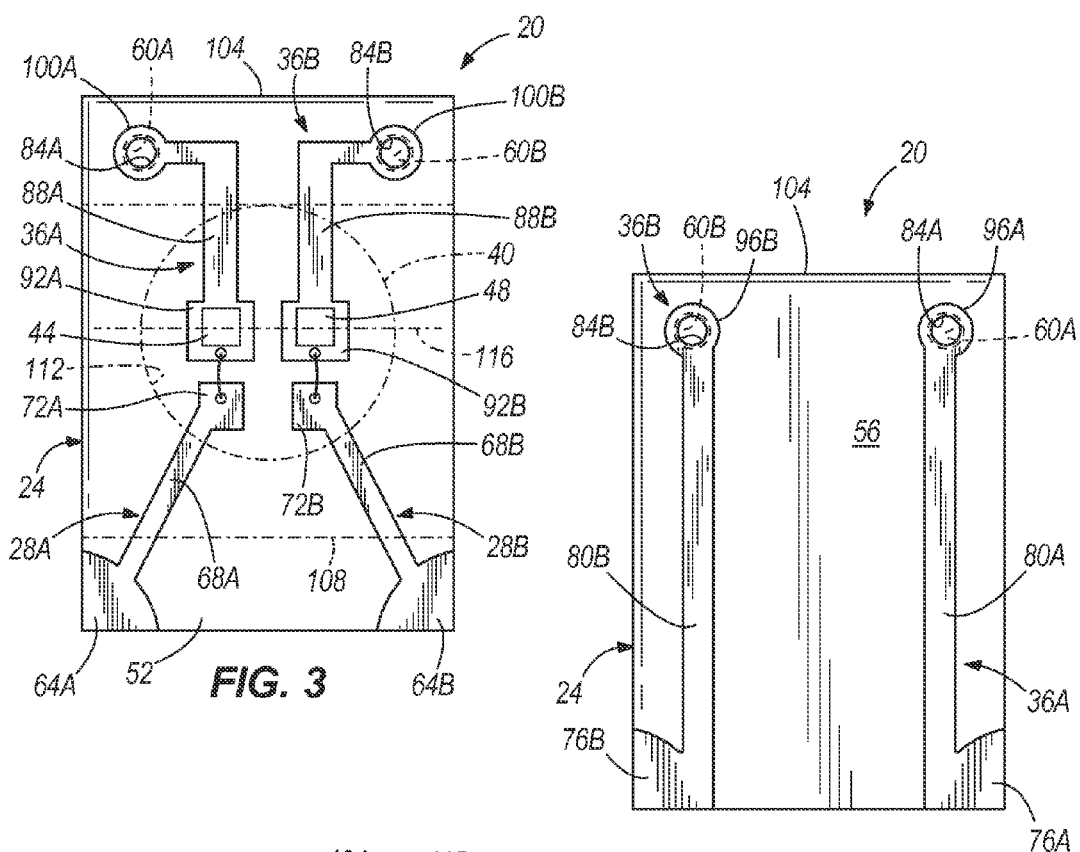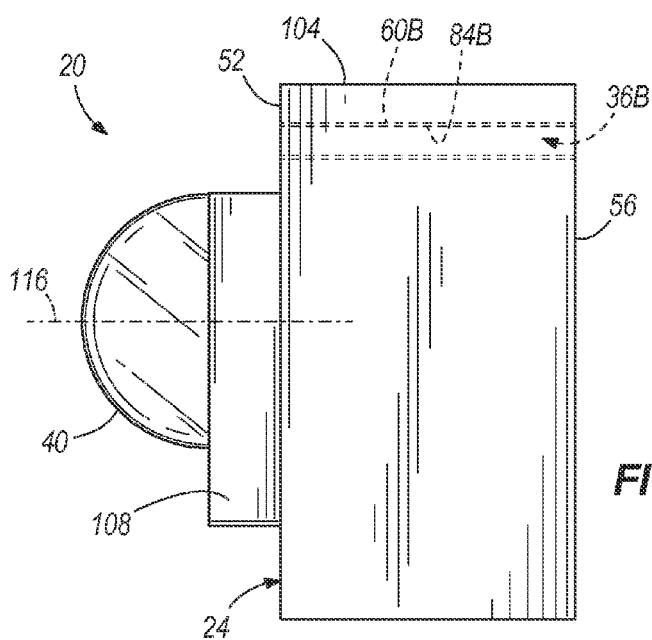

ILLUMINATION DEVICE

RELATED APPLICATIONS

The present application claims the benefit of co-pending U.S. Provisional Patent Application No. 61/726,675, filed Nov. 15, 2012, the entire contents of which is incorporated herein by reference.

FIELD OF THE INVENTION

The present disclosure generally relates to illumination devices and, more particularly, to illumination devices adapted to couple to substrates, such as printed circuit boards.

BACKGROUND

Illumination devices, such as light emitting diodes (LEDs), have become a part of our everyday lives and are incorporated into a wide variety of applications. A large variety of LEDs exist that collectively offer a wide variety of lighting capabilities. However, each individual LED has a limited capability. For example, LEDs may only have a single output color. Additionally, LEDs that are surface mounted to a printed circuit board (PCB) may have a low rise distance above a mounting surface of the PCB. A low rise distance from a mounting surface of the PCB is particularly troublesome when the LED is a right angle output LED, which emits light generally at a right angle to an axis extending perpendicular to the mounting surface of the PCB. In other words, a right angle output LED may emit light parallel to a mounting surface of the PCB. Furthermore, right angle LEDs require additional components, such as light guides or reflective surfaces, to transfer the light from emission along an axis perpendicular to the mounting surface of the PCB to emission along an axis parallel to the mounting surface of the PCB. Utilization of such additional components diminishes the brightness and effectiveness of the LED.

Moreover, such conventional LEDs are typically comprised of several components manufactured independently of each other and subsequently connected together using adhesive, press-fit, interference-fit, snap-fit, or some other manner of connection. Connecting components together in this manner creates opportunities for incorrect assembly of the LED when tight tolerances are important for such LEDs. For example, some LEDs include a housing and a lens, and the lens is press-fit into the housing. Pressing the lens too lightly or too firmly into the housing can improperly position the lens, thereby diminishing LED performance. As indicated above, light guides or other reflective components may be required to alter light emission into a desired direction. Assembly of such light guides or other reflective members in the LED may create additional opportunities for incorrect assembly, thereby further diminishing LED performance.

SUMMARY

The present disclosure is defined by the following claims, and nothing in this section should be taken as a limitation on those claims.

In one aspect, an illumination device is provided and includes a housing including a plurality of electrically conductive leads. The illumination device also includes a lens unitarily formed as one-piece with the housing and a first light source electrically coupled to at least one of the plurality of electrically conductive leads and positioned behind the lens. The first light source is adapted to emit light of a first color. The illumination device further includes a second light source electrically coupled to at least another one of the plurality of electrically conductive leads and positioned behind the lens. The second light source is adapted to emit light of a second color different than the first color. The illumination device is adapted to be coupled to a surface of a substrate and emit light through the lens generally parallel to the surface.

In another aspect, a right angle illumination device adapted to couple to a surface of a printed circuit board is provided. The illumination device includes a housing including a first surface, a second surface opposite the first surface, a first aperture defined through the housing from the first surface to the second surface, a second aperture defined through the housing from the first surface to the second surface, a first lead positioned on the first surface and including a first contact positioned at a first corner of the first surface, a second lead positioned on the first surface and including a second contact positioned at a second corner of the first surface, and a third lead positioned on the first surface and the second surface and extending through the first aperture between the first surface and the second surface. The third lead includes a third contact positioned at a first corner of the second surface. The housing also includes a fourth lead positioned on the first surface and the second surface and extending through the second aperture between the first surface and the second surface. The fourth lead includes a fourth contact positioned at a second corner of the second surface. The illumination device also includes a lens unitarily formed as one-piece with the housing on the first surface of the housing and a first light source electrically coupled to the first lead and the third lead and positioned behind the lens. The first light source is adapted to emit light of a first color. The illumination device further includes a second light source electrically coupled to the second lead and the fourth lead and positioned behind the lens. The second light source is adapted to emit light of a second color different than the first color.

BRIEF DESCRIPTION OF THE DRAWINGS

The disclosure can be better understood with reference to the following drawings and description. The components in the figures are not necessarily to scale, emphasis instead being placed upon illustrating the principles of the disclosure.

FIG. 3 is a front view of the illumination device shown in FIG. 1 with a lens and a portion of the housing shown in phantom to illustrate components behind the lens and portion of the housing, in accordance with one embodiment.

FIG. 4 is a rear view of the illumination device shown in FIG. 1, in accordance with one embodiment.

FIG. 5 is a left side view of the illumination device shown in FIG. 1, in accordance with one embodiment.

DETAILED DESCRIPTION

Figure 1:
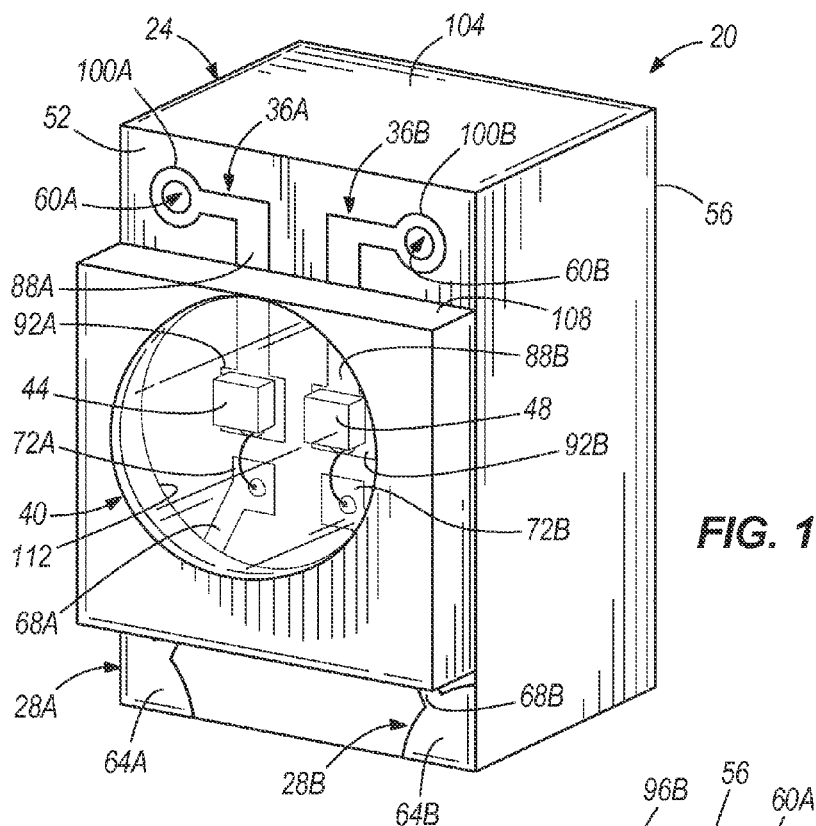
FIG. 1 is a top front perspective view of an illumination device, in accordance with one embodiment.
Figure 2:
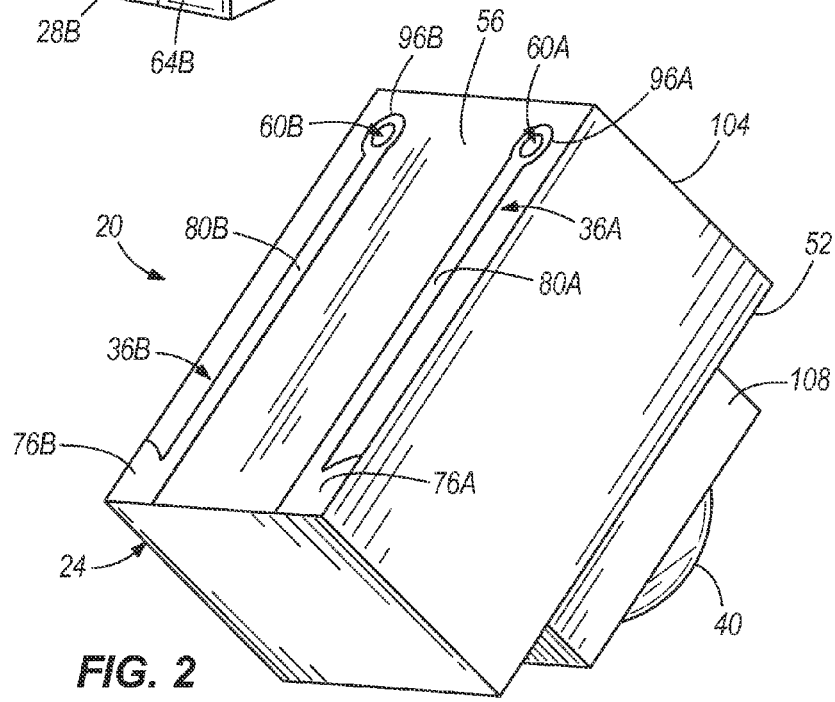
FIG. 2 is a bottom rear perspective view of the illumination device shown in FIG. 1, in accordance with one embodiment.

With reference to FIGS. 1-5, an exemplary illumination device 20 in accordance with one embodiment of the present disclosure is illustrated. The illumination device 20 is adapted to couple to a substrate such as, for example, a printed circuit board (PCB). The illumination device 20 may be coupled to the PCB in a variety of manners such as, for example, soldering. In some instances, circuit densities (i.e., the number of components on a circuit board and the proximity of such components to each other) and/or requirements of a particular application require the illumination device 20 to emit light at a particular angle relative to the PCB. In the illustrated exemplary embodiment, the illumination device 20 is adapted to emit light along an axis generally parallel to a mounting surface of the PCB. Stated in another manner, the illumination device 20 is adapted to emit light generally at a right angle to an axis perpendicular to the mounting surface of the PCB. In practice, illumination in this manner is generally referred to as right angle light emission and the illumination device 20 may be referred to as a right angle illumination device 20.

The illumination device 20 includes a housing 24, a plurality of leads 28A, 28B, 36A, 36B, a lens 40, and a pair of light sources 44, 48. The illumination device 20 is unitarily formed as one-piece, thereby eliminating the need for assembly of multiple components. More particularly, the housing 24, leads 28A, 28B, 36A, 36B, lens 40, and light sources 44, 48 are all manufactured together and are unitarily formed as one-piece upon completion of manufacturing. Thus, for example, the lens 40 does not require assembly to the housing 24 subsequent to manufacturing. In some exemplary embodiment, a consumer or individual incorporating the illumination device 20 into a circuit merely purchases the illumination device 20 and couples it to the substrate with no other steps or assembly required. This eliminates, for example, the possibility of incorrectly assembling the lens to the housing. Moreover, all steps of manufacturing and assembly are performed by automated equipment, thereby eliminating the need for manual assembly steps. Manual assembly steps have a greater opportunity for introducing errors into the final assembled product. For example, manually assembling a lens to a housing can result in improper assembly because the lens may be pressed too far into the housing, pressed not enough into the housing, etc.

The housing 24 is constructed of an electrically non-conductive material that electrically isolates the plurality of leads 28A, 28B, 36A, 36B from one another. In the illustrated exemplary embodiment, the illumination device 20 includes a pair of anode leads 28A, 28B and a pair of cathode leads 36A, 36B. The anode leads 28A, 28B are positioned on a front surface 52 of the housing 24 and the cathode leads 36A, 36B are positioned on both the front and rear surfaces 52, 56 of the housing 24. Additionally, the cathode leads 36A, 36B pass through the housing 24 from the front surface 52 to the rear surface 56 via lead apertures 60A, 60B defined in the housing 24. It should be understood that the leads may be configured in a variety of manners different than the illustrated exemplary embodiment. For example, the anode leads and the cathode leads may be interchanged with one another such that cathode leads may be positioned on the front surface and the anode leads may be positioned on the front surface, the rear surface, and pass through the apertures 60A, 60B. Also, for example, one of each of the anode and cathode leads could be positioned on the front surface and one of each of the anode and cathode leads could be positioned on the rear surface.

All of the leads 28A, 28B, 36A, 36B are electrically separated and constructed of an electrically conductive material. In some exemplary embodiments, the leads 28A, 28B, 36A, 36B are constructed of nickel-plated or tin-plated copper or steel, or from other suitable electrically conductive material. In the illustrated exemplary embodiment, each of the anode leads 28A, 28B terminates at one end in a contact 64A, 64B at a respective lower front corner of the front surface 52 of the housing 24. Along with the contact 64A, 64B, each anode lead 28A, 28B includes a first electrically conductive portion 68A, 68B extending upward along the front surface 52 of the housing 24 away from the contact 64A, 64B and a second electrically conductive portion 72A, 72B at the upper end of the first conductive portion 68A, 68B. In the illustrated exemplary embodiment, the second electrically conductive portion 72A, 72B is wider than the first conductive portion 68A, 68B and is generally square in shape.

In the illustrated exemplary embodiment, each of the cathode leads 36A, 36B terminates in a contact 76A, 76B at a respective lower rear corner of the rear surface 56 of the housing 24. Along with the contact 76A, 76B, each cathode lead 36A, 36B includes a first electrically conductive portion 80A, 80B extending upward along the rear surface 56 of the housing 24 away from the contact 76A, 76B, a second electrically conductive portion 84A, 84B extending through the associated lead aperture 60A, 60B, and a third electrically conductive portion 88A, 88B extending along the front surface 52 of the housing 24 terminating in a fourth electrically conductive portion 92A, 92B that is wider than the third conductive portion 88A, 88B and generally square in shape. The first conductive portion 80A, 80B includes an upper end 96A, 96B that is generally circular in shape and is concentric about the associated lead aperture 60A, 60B. The second conductive portion 84A, 84B lines the entire interior of the lead aperture 60A, 60B. Alternatively, the second conductive portion 84A, 84B may line only a portion of the lead aperture 60A, 60B. The third conductive member 88A, 88B includes an end 100A, 100B that is generally circular in shape and is concentric about the associated lead aperture 60A, 60B. The third conductive portion 88A, 88B also extends laterally in a direction substantially parallel to a top surface 104 of the housing 24 and then extends downward perpendicularly relative to the laterally extending part of the third conductive member 88A, 88B toward the fourth conductive portion 92A, 92B. The fourth electrically conductive portion 92A, 92B is wider than the third conductive portion 88A, 88B and is generally square in shape. The fourth conductive portion 92A, 92B of the cathode leads 36A, 36B is also larger than the second conductive portion 72A, 72B of the anode leads 28A, 28B.

It should be understood that the illustrated exemplary leads are exemplary configurations of the leads and that these exemplary lead configurations are not intended to be limiting. Rather, the leads are capable of assuming any configuration and all of such configurations are intended to be within the spirit and scope of the present disclosure. For example, the housing may include cutouts or indentations at the front and rear bottom corners thereof and the contacts of the leads may be within the cutouts or indentations. Additionally, the lead apertures 60A, 60B may be defined through the housing 24 at different locations and the leads will be configured to accommodate such different locations.

In the illustrated exemplary embodiment, the illumination device 20 includes two light sources 44, 48. The light sources 44, 48 may be a wide variety of different types of light sources and all of such possibilities are intended to be within the spirit and scope of the present disclosure. In some exemplary embodiments, the light sources 44, 48 may be LED chips. The LED chips may be electrically mounted on the fourth electrically conductive portions 92A, 92B of the cathode leads 36A, 36B (one LED chip on each fourth portion) and a wire bond may be formed on the top of each of the LED chips and extend to the second electrical conductive portion 72A, 72B of the associated anode lead 28A, 28B, thereby electrically coupling the LED chips to the anode leads 28A, 28B. In other exemplary embodiments, the light sources 44, 48 may be other types of light sources such as, for example, chips with phosphor, etc., and such various types of light sources may be coupled to the leads in respective appropriate manners.

Each light source 44, 48 is adapted to illuminate a different color, thereby providing the illumination device 20 with three lighting capabilities. The illumination device 20 may solely illuminate the first light source 44 to emit a first color of light, solely illuminate the second light source 48 to emit a second color of light, or simultaneously illuminate both light sources 44, 48 to illuminate a third color, which is a combination of the first and second colors. Additionally, light simultaneously emitted by both light sources 44, 48 may be brighter or more intense than only illuminating one of the light sources 44, 48. The light sources 44, 48 may emit light of any possible color, thereby providing the illumination device 20 the capability of illuminating any combination of colors.

The housing 24 includes a projection 108 extending out from the front surface 52 of the housing 24 and the projection defines an aperture 112 there through aligned with the light sources 44, 48. The lens 40 is unitarily formed as one-piece with the housing 24 and aligns with and over the aperture 112 defined in the projection 108. The lens 40 is transparent or translucent as desired to facilitate light transmission there through and is dome or hemispherical shaped. Alternatively, the lens 40 may have different configurations and be within the intended spirit and scope of the present disclosure. With the illumination device 20 having this configuration, the light sources 44, 48 are positioned directly behind the lens 40 and generally aligned with a vertical centerline 116 of the lens 40, thereby facilitating a straight line of light emission through the lens 40. This straight line of light emission is substantially parallel to a mounting surface of the PCB or substantially perpendicular to an axis extending vertically and longitudinally through the housing 24. Light pipes and light bending are not required with the illumination device 20. Thus, the illumination device 20 may have better brightness quality over other illumination devices requiring light pipes or light bending.

The illumination device 20 also has a high rise above the mounting surface of the PCB to which the illumination device 20 may be coupled. Conventional right angle illumination devices have their lens and light source very close to the mounting surface of PCBs, thereby providing a low rise above the mounting surface of the PCB. The lens 40 and light sources 44, 48 of the illumination device 20 are positioned at a relatively large distance above the mounting surface of the PCB. In the illustrated exemplary embodiment, the vertical centerline 116 of the lens 40 is about 2 millimeters above the mounting surface of a PCB. In other exemplary embodiments, the vertical centerline 116 of the lens 40 may be between about 1.5 millimeters and about 3.0 millimeters above the mounting surface of the PCB. In further exemplary embodiments, the vertical centerline 116 of the lens 40 may be between about 2 millimeters and about 40 millimeters above the mounting surface of the PCB. In the illustrated exemplary embodiment, the light sources 44, 48 are generally aligned with the vertical centerline 116 of the lens 40. In other exemplary embodiments, the light sources 44, 48 may be displaced from the vertical centerline 116 of the lens 40 any desired distance.

It should be understood that the use of any orientation or directional terms herein such as, for example, "front", "back", "rear", "top", "bottom", "left", "right", "side", etc., is not intended to imply only a single orientation of the item with which it is associated or to limit the present disclosure in any manner. The use of such orientation or directional terms is intended to assist with the understanding of principles disclosed herein and to correspond to the exemplary orientation illustrated in the drawings. For example, the illumination device 20 may be coupled to a substrate such as, for example, a PCB positioned in any orientation and terms such as "front", "back", "rear", "top", "bottom", "left", "right", "side", etc., would be utilized to correspond to the PCB in any of the exemplary orientations. The use of these terms in association with the illumination device 20 is not intended to limit the illumination device 20 to a single orientation or to limit the illumination device 20 in any manner.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While various embodiments of the disclosure have been described, it will be apparent to those of ordinary skill in the art that other embodiments and implementations are possible within the scope of the disclosure. Accordingly, the disclosure is not to be restricted except in light of the attached claims and their equivalents.

The invention claimed is:

1. An illumination device comprising:
    a housing including a plurality of electrically conductive leads;
    a lens unitarily formed as one-piece with the housing;
    a first light source electrically coupled to at least one of the plurality of electrically conductive leads and positioned behind the lens, the first light source adapted to emit light of a first color; and
    a second light source electrically coupled to at least another one of the plurality of electrically conductive leads and positioned behind the lens, the second light source adapted to emit light of a second color different than the first color;
    wherein the illumination device is adapted to be coupled to a surface of a substrate and emit light through the lens generally parallel to the surface.

2. The illumination device of claim 1, wherein each of the plurality of electrically conductive leads includes a contact adapted to electrically couple to the surface of the substrate.

3. The illumination device of claim 2, wherein the plurality of electrically conductive leads comprises four electrically conductive leads and four contacts adapted to electrically couple to the surface of the substrate.

4. The illumination device of claim 3, wherein a first two of the contacts are positioned on a first surface of the housing at corners of the first surface, and wherein a second two of the contacts are positioned on a second surface of the housing at corners of the second surface.

5. The illumination device of claim 1, wherein the plurality of electrically conductive leads comprises two anode leads and two cathode leads.

6. The illumination device of claim 5, wherein each of the anode leads includes an anode contact and each of the cathode leads includes a cathode contact, and wherein the anode contacts are positioned at bottom corners of a front surface of the housing and the cathode contacts are positioned at bottom corners of a rear surface of the housing.

7. The illumination device of claim 6, wherein the lens is positioned on the front surface of the housing.

8. The illumination device of claim 6, wherein the first light source is electrically coupled to one of the anode leads and one of the cathode leads, and wherein the second light source is electrically coupled to another one of the anode leads and another one of the cathode leads.

9. The illumination device of claim 6, wherein the housing defines a first aperture and a second aperture there through from the front surface to the rear surface, and wherein one of the cathode leads passes through the housing from the front surface to the rear surface through the first aperture and another one of the cathode leads passes through the housing from the front surface to the rear surface through the second aperture.

10. The illumination device of claim 9, wherein the anode leads are positioned on the front surface of the housing and the cathode leads are positioned on the front surface and the rear surface of the housing, and wherein the anode leads and the cathode leads terminate on the front surface.

11. The illumination device of claim 10, wherein the first light source is positioned on and electrically coupled to one of the cathode leads at a location where the one of the cathode leads terminates, and wherein the second light source is positioned on and electrically coupled to another one of the cathode leads at a location where the another one of the cathode leads terminates.

12. The illumination device of claim 1, wherein the first and second light sources are generally aligned with a center of the lens.

13. The illumination device of claim 1, wherein the first and second light sources are LED chips.

14. The illumination device of claim 1, wherein the lens is dome shaped.

15. A right angle illumination device adapted to couple to a surface of a substrate, the illumination device comprising:
   a housing including
      a first surface,
      a second surface opposite the first surface,
      a first aperture defined through the housing from the first surface to the second surface,
      a second aperture defined through the housing from the first surface to the second surface,
      a first lead positioned on the first surface and including a first contact positioned at a first corner of the first surface,
      a second lead positioned on the first surface and including a second contact positioned at a second corner of the first surface,
      a third lead positioned on the first surface and the second surface and extending through the first aperture between the first surface and the second surface, the third lead including a third contact positioned at a first corner of the second surface, and
      a fourth lead positioned on the first surface and the second surface and extending through the second aperture between the first surface and the second surface, the fourth lead including a fourth contact positioned at a second corner of the second surface;
   a lens unitarily formed as one-piece with the housing on the first surface of the housing;
   a first light source electrically coupled to the first lead and the third lead and positioned behind the lens, the first light source adapted to emit light of a first color; and
   a second light source electrically coupled to the second lead and the fourth lead and positioned behind the lens, the second light source adapted to emit light of a second color different than the first color.

16. The illumination device of claim 15, wherein the first and second light sources are generally aligned with a center of the lens.

17. The illumination device of claim 15, wherein the first and second light sources are LED chips.

18. The illumination device of claim 15, wherein the lens is dome shaped.

19. The illumination device of claim 15, wherein the first lead is a first anode lead, the second lead is a second anode lead, the third lead is a first cathode lead, and the fourth lead is a second cathode lead.

20. The illumination device of claim 19, wherein the first and second anode leads and the first and second cathode leads terminate on the first surface, and wherein the first light source is positioned where the first cathode lead terminates and the second light source is positioned where the second cathode lead terminates.

* * * * *